United States Patent
Nahar et al.

(10) Patent No.: US 9,081,051 B2
(45) Date of Patent: Jul. 14, 2015

(54) METHODS FOR TESTING MANUFACTURED PRODUCTS

(75) Inventors: Amit Vijay Nahar, Allen, TX (US); Ben Chia-Ming Chang, Allen, TX (US); Nelson Kei Leung, Plano, TX (US); Francis Eongsoo Lim, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 663 days.

(21) Appl. No.: 13/269,831

(22) Filed: Oct. 10, 2011

(65) Prior Publication Data

US 2013/0088253 A1    Apr. 11, 2013

(51) Int. Cl.
*G01R 31/26* (2014.01)
*G01R 31/28* (2006.01)

(52) U.S. Cl.
CPC ........ *G01R 31/2834* (2013.01); *G01R 31/2894* (2013.01)

(58) Field of Classification Search
CPC ............... G01R 31/2894; G01R 31/31707; G01R 31/31718; G01R 31/2834; G01R 31/01; G01R 31/283
See application file for complete search history.

(56) References Cited

U.S. PATENT DOCUMENTS

| 7,292,058 | B2 * | 11/2007 | Anderson et al. | 702/118 |
| 7,395,170 | B2 * | 7/2008 | Scott et al. | 702/118 |
| 8,126,681 | B2 * | 2/2012 | Nahar et al. | 702/190 |

\* cited by examiner

*Primary Examiner* — Vinh Nguyen
(74) *Attorney, Agent, or Firm* — Steven A. Shaw; Frank D. Cimino

(57) ABSTRACT

The problem of high test cost of manufactured goods can be partially solved by lowering the percentage of the goods to be tested methodically while keeping the total defective portion of the goods expressed in DPPM below a preset target value. The method includes identifying a first test that is capable of screening out enough parts that would fail a second test so that the portion of the parts to be tested second test can be reduced. The number of parts screened out by the first test determines if the reduced testing scheme would violate the preset DPPM target value.

8 Claims, 1 Drawing Sheet

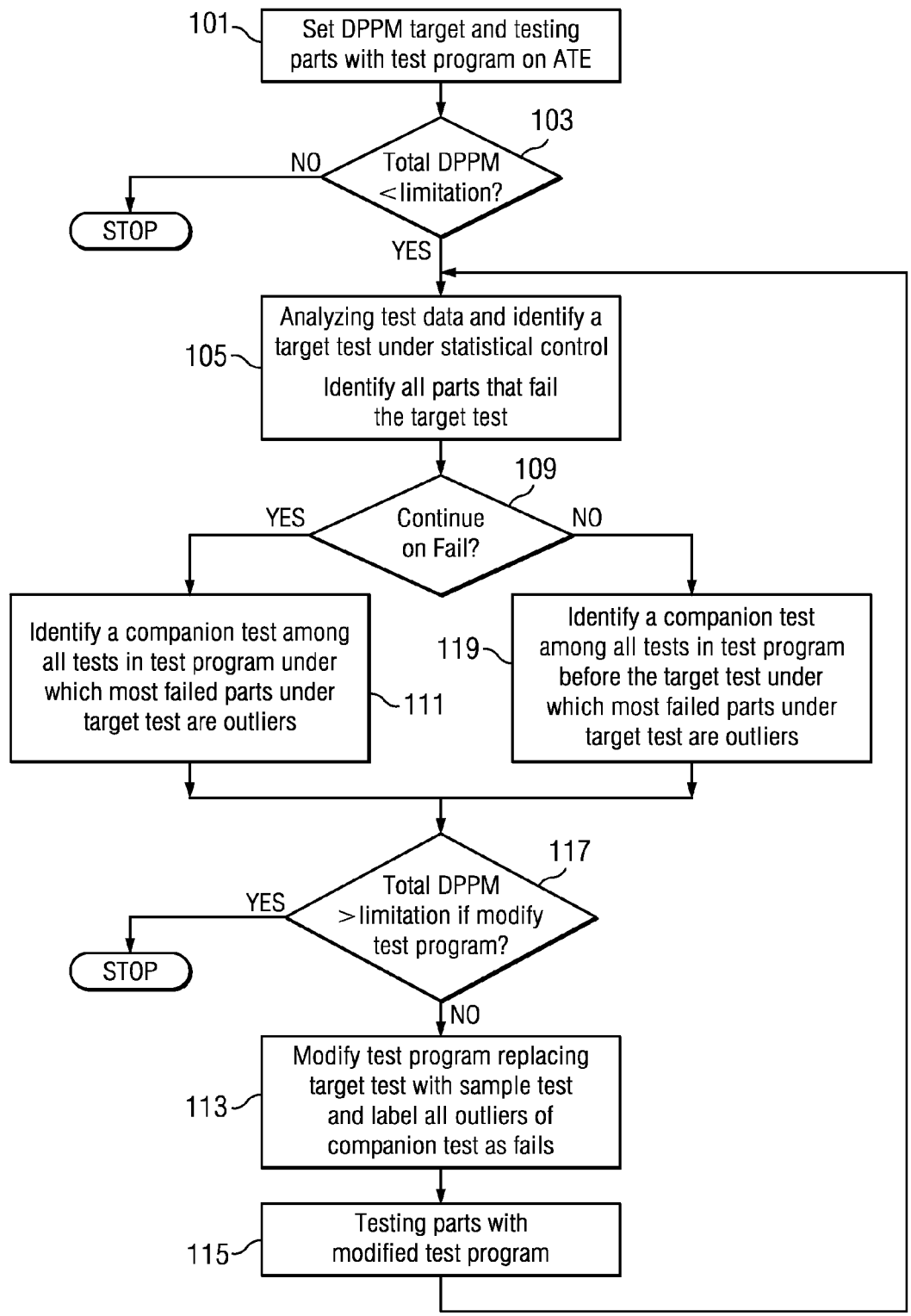

METHODS FOR TESTING MANUFACTURED PRODUCTS

FIELD OF THE INVENTION

The present invention relates generally to testing of manufactured products and, more particularly, to testing semiconductor devices.

BACKGROUND

Manufacturers test their products before shipping them to their customers to screen out as many defective parts as practical so the shipped products will satisfy the demand of the customers.

As an example, the manufacturers of semiconductor devices produce product that are used in automobiles, aircrafts, smart phones, medical diagnostic tools and treatment equipment, and entertainment products such as televisions sets and video games, etc. The customer who incorporates a semiconductor device in its product expects the device to perform properly to the specification.

In turn, the semiconductor manufacturer depends on its vendors and suppliers for clean rooms, starting wafers, consumable chemicals including gases and metals, photo masks and reticles, design software tools, design terminals and computing equipment, manufacturing equipment including implanters, diffusion tools, CVD tools, etching equipment, testers, handlers, bake ovens, probe cards, wire-bonders, molding equipment, etc. And the semiconductor manufacturer expects that those deliverables be thoroughly tested accordingly.

Product testing is challenging. At the start of a product design phase, the design may have weaknesses that may take a few iterations to amend. The weaknesses may manifest themselves at test of initial production runs or pilot runs. Many parts may fail multiple tests and the total product yield is low. The challenge in testing during this phase is to correlate the fails to design flaws and fabrication process margins.

Once a new design has been adequately "debugged" and the process of fabrication has been "fine tuned," one can expect the defective portion of the new production to decrease. The challenge of testing then is to separate the defects due to design and manufacturing shortcomings from defects due to a second cause—the random defects that may be beyond a manufacturer's control. Examples of this type of defects in the semiconductor manufacturing include those caused by the minutest impurities or crystal imperfections in the starting wafer, dust particles that escape the most stringent filtering system in the clean room, and the slightest perturbation in electric power supply system throughout the fabrication flow, etc.

Because the manufacturer strives for but can not expect every device it produces to perform as designed, testing remains necessary to screen out the portion of the products that for one reason or another fails to meet all the product specifications, particularly due to defects of random causes.

Statistics play an important role in modern testing, especially when products mature. At this stage, one expects the defective parts to become an increasingly small portion of the total production and therefore depends more heavily on statistical analysis techniques to sort out the failure mechanisms and to improve production yield.

One tool that is widely used in the art of manufacturing is the capability index. It is used to quantify the robustness of a design and the manufacturing process with which the designed product is fabricated. The capability index, or capability ratio, is a statistical measurement of product performance, that is, the probabilistic expectation of the percentage of a production to function within specification limits.

Most product performance specifications have an upper and a lower specification limits USL and LSL, and a target mean T, the tested mean is p and the variability, expressed as a standard deviation, is σ. The commonly-accepted capability indices expressed in these terms include $C_p$ and $C_{pk}$, defined as follows:

$$C_p = (USL - LSL)/6\sigma \quad (1)$$

where $C_p$ is a measurement of what the product performance is capable of if the mean were to be centered between the specification limits, assuming the measured output are approximately normally distributed; and $$C_{pk} = \min\left[(USL-\mu)/3\sigma, (\mu-LSL)/3\sigma\right] \quad (2)$$

where $C_{pk}$ is a measurement of what the product performance is capable of, when the mean may not be centered between the specification limits.

With the terms defined as above, the capability of a particular product can be readily qualified and thus easily apprehended. For example, when the $C_{pk}$ of a product performance reaches or stays above one, one can expect that out of a million devices manufactured, no more than 2,700 devices will likely be outside of the specification limits assuming the test results follow a normal distribution; and when the $C_{pk}$ reaches 1.67, then the number of fallouts should be smaller than 1 ppm.

As a product matures, the testing result in terms of Cpk will raise to reflect the increasing of the product yield. Traditionally when it reaches a preset number, the manufacturer has a choice regarding its future product testing. It may choose continuingly testing all products in order to screen out the few parts that would fail the test, or skipping the test or only testing a small sample of the future products as a sentinel against process shift but let the few failed parts escape.

SUMMARY OF THE INVENTIONS

Applicants recognized that both approaches have serious drawbacks. On the one hand, skipping a test or reducing a testing to sampling does reduce test time and consequently reduce overall manufacturing cost of the product. But it is not viable in many occasions, particularly when the number of potential defective parts may become higher than what a customer is willing to accept. On the other hand, competition forces each manufacturer to reduce cost, and full testing may not be financially viable.

Applicants resolved this problem by systematically monitoring the testing results of their on-going production and then by reducing test time methodically while keeping the total defective parts that may escape unchecked under control. Several methods are disclosed in this paper and they are summarized below.

When a production is maturing such that the test results under a particular test show that the product performs is under statistical control, that is, when $C_{pk}$ of the result of this particular test is above a set value, it represents an opportunity for testing time reduction. However, unlike the traditional approach of skipping this test and letting escape the few defective parts, Applicants seek out a companion test that is capable to cover the function of both tests. Only after the search identifies such a test, can one safely proceed with test time reduction with a safe guard against jeopardizing the product quality.

A test program used in testing manufactured parts may comprise many individual tests. In the case of testing a semiconductor chip, a typical test program may comprise hundreds of individual tests. Not all tests are suitable as the companion test for the purpose of reducing test time. A suitable test for this purpose is defined as having the capability of screening out a high percentage of the failed parts that the first test is designed to detect. Practically, all or at least a majority of those parts should be among the outliers or among the failed parts under the second test.

A distinction should be made regarding the parts that are referred to as outliers to a statistical distribution. When the $C_{pk}$ of a test is set at 1.67, for example, the USL and LSL are at least +/−5σ away from the tested mean. Any part whose test value lies outside of 3σ, for example, but is not outside of the limitations is referred to in this paper as an outlier; but when it is outside of the 5σ limitations, it is called a failed part, or simply a fail.

If one successfully identifies a companion test that satisfies the above requirement, a test that can "catch" a majority of the fails that would have failed the first test, then the first test may be reduced to sampling without compromising the quality level of the product if the outliers are labeled as failed parts and are excluded from further processing.

The methodology described in this application can be repeated throughout the life span of the product if further test time reduction is desirable.

In the detailed description of examples that embody the inventions, Applicants will demonstrate the concept using test procedures for a semiconductor device. However, this concept can be readily applied to other manufactured products as long as the test results can be quantified and analyzed follow the principles of statistics.

BRIEF DESCRIPTION OF THE DRAWING

F*ig*.1 shows a flow chart for performing test procedures.

DETAILED DESCRIPTION

The following discussion is directed to various embodiments. Although one or more of these embodiments may be preferred, the embodiments disclosed should not be interpreted as limiting the scope of the invention.

EXAMPLE 1

Test 1 of a Printer-Head Control Chip

A semiconductor chip designed for controlling a printer head undergoes hundreds of tests when it is still a part of a wafer and again when it is singulated from the wafer and individually packaged. Test programs used to test this chip are loaded in automated testing equipment and comprise hundreds of individual tests. If the chip is tested in wafer form, a probe card is used to interrogate each chip on the wafer. Modern probe cards may have the capability to probe multiple chips simultaneously.

After probing, the chips that survive the tests are packaged individually. In packaged form, the chips may go through another around of testing. The tests in this round of testing, which is sometimes referred to as the "final test," may or may not be identical to the tests in wafer probe.

In this example, only 12 of the tests are included for clarity. The tests are listed in the following table according to the sequence of testing, followed by test names, typical test limitations and brief descriptions.

| Test number | Test Name | Limitations | Brief description |
| --- | --- | --- | --- |
| 1 | Continuity | −1 v/−0.5 V | Open & short test |
| 2 | Leakage | +/−1 μA | Test of current flowing into input pins at H/L logic level |
| 3 | IDDQ | 10 μA | Test of quiescent current with BIST |
| 4 | Power Supply | 100 mA | Test of current flowing into VDD pin |
| 5 | Regulator | 30 mV | Test of regulator output voltage |
| 6 | LDO | 100 mV | Another regulator output voltage test |
| 7 | Timing | 25 nS | Test of frequency, rise and fall times, etc |
| 8 | A/D Tests | +/−½ LSB | Test of offset, gain, linearity, etc of ADC |
| 9 | Encoder Gain | 10 dB | Test of signal gain of CODEC |
| 10 | Power Down | 0.1 mA | Test of current under sleep and power-off modes |
| 11 | Leakage 2 | +/−1 μA | Test of current flowing into input pins at H/L logic level |
| 12 | Contact Resistance | 40 ohm | Test of contact between testing hardware and IC terminals |

At the beginning of the chip production, wafers from a "pilot run" may be tested for the purposes of verifying and characterizing the chip design and the fabrication process. During this phase, the wafers may be tested in the mode of "continue-on-fail (COF)." That is to say that each chip on the wafers is tested with all the tests in the test program. When a chip fails a test—the test result lies outside of the predetermined test limitations—testing continues on the chip until all the tests in the test program are performed. With COF, test data collection is more complete. However, this approach obviously makes test time long, therefore it is not performed after the chip and the process are fully characterized.

The alternative to continue testing on fails is to stop testing on fail (SOF.) With SOF mode, when a product—a chip in this example—under test fails a test, the ATE logs the test result and skips the remaining tests in the test program and moves to the next chip and commences testing it.

In modern testing with ATE, a vast amount of test data are collected and analyzed with aid of automated data analyzer such as high speed workstation with software designed for performing statistical analyses.

Referring now to drawing FIG. 1, at step 101, semiconductor chips, either in wafer form or after individually packaged, are tested on an automated tester (ATE). A test program, which may comprises hundreds of individual tests is loaded into the ATE, which executes the sequence of testing according to the test program.

A quality indicator often used in association with a semiconductor chip production is the total defective parts per million (DPPM). At step 101, a DPPM target is set. DPPM may be used by the manufacturer as a factor for setting the price of its product; or it may be used by the customer as a threshold of acceptance. In this example, the DPPM target is set at 100 or less.

At step 103, tests include tests 1 through 12 are performed on a plurality of chips and test data from all tests are analyzed with aid of high speed computer and software. Among many purposes, the analysis looks for a target test—a test under which the resulting data of the chips tested are "under statistical control." In certain circumstances, under statistical control is defined when the $C_{pk}$ of the test result is equal to or greater than 1.33; in other circumstances, the $C_{pk}$ may need to be greater than 1.67. Other $C_{pk}$ values may also be chosen.

When the result of a test is "under statistical control," it is considered that barring unforeseeable events, the yield of the chips under this test is likely to repeat in the future. If the fabrication process remains stable, one can reason that even without testing future production with this test, the number of potential defective parts that will escape is known. Assuming the $C_{pk}$ is set at 1.67 and assuming the process is closely monitored, statistically speaking, for every 1 million parts tested, no more than 1 part will likely fail this test due to random defect. With all tests in the test program tallied, one can arrive at a projected DPPM number for future production. If the total DPPM as a result of all tests is lower than the preset target, then one may move to reduce the test time as follows.

For purpose of illustration, one may assume that in the example, about 500,000 print-head control chips were tested with the test program. And further assuming that, among the 12 tests, test number 9—Encoder Gain test is under statistical control and 2 parts numbered x and y fail test number 9.

At step 105, one searches the test program for at least one test other than test 9 that consistently identifies the defective parts x and y from the above mentioned "under control" test 9.

As discussed in a previous section, chips may be tested under either COF or SOF mode. Step 109 depicts a branching that determines which tests should be searched for the companion test that may supplant test number 9 in the effort to reduce test time. In this example, the chips are tested on continue-on-fail mode, so the flow branches to step 111.

Because part x and part y have gone through all tests in the test program, in step 111, test results of part x and y among all tests except test 9 may be analyzed to determine if any other test or tests identify at least one or both as outliers or as fails.

An outlier is defined in this application as a tested part or chip in this example with a test result that appears to deviate markedly from test results of other tested chips. Statistically speaking, an outlier chip is a chip whose test result maybe $3\sigma$ away from the average of all chips tested. In this example of printer-head control chip, one looks for a companion test under which chips x and y are outliers or fails. In other words, chip number x and y may not fail the companion test but the test results of chips number x or y or both under the companion test deviate markedly from the average of test results of other chips tested under the companion test.

Once a companion test is identified that all or a number of chips that fail test number 9 also fail the companion test or are identified as outliers, then the companion test may be used to supplant test 9 for the purpose of screening out defective parts.

If all failed chips under test number 9 also fall the companion test or are identified as outliers under it, then by relabeling the outliers as fails, one would be confident that all chips that would fail test 9 will be removed from the lot even without performing test 9. Therefore test 9 may be skipped or reduced to sampling without adverse effect on the DPPM goal and the test time attributed to test 9 is eliminated or drastically reduced.

If not all failed chips under test 9 are outliers under the companion test, one can still estimate with high confidence the number of fails that may escape the companion test—those chips that would fail test 9 but would not fail the companion test or be identified as outliers. In this case, if chip x or chip y falls into this category, one needs to update the DPPM total count according to the total number of chips tested.

At step 117, the new DPPM count is then compared to the preset target. If the new DPPM exceeds the preset target, then test 9 should stay in the test program. On the other hand, if the new DPPM count remains lower than the acceptable target, then the test program can be modified to reduce the total test time.

At step 113, the test program is modified such that future production chips are only sample-tested with test 9 to ensure that the manufacturer is made aware of any shift in process that cause the test data characteristic to shift and corrective action can be taken timely to maintain the repeatability of the fabrication process. The companion test is also modified so all outliers under this test will be labeled as fails and subsequently to be removed from the lot.

At step 115, the modified test program is implemented for testing future production chips. The DPPM count and new test results will be monitored for futher reduction of test time.

EXAMPLE 2

Test 2 of a Printer-Head Control Chip

In Test 2, the chips are tested in "stop on fail" (SOF) mode. This mode is usually used in volume production phase where test time cost is more keenly emphasized than in product characterization phase. With SOF, when a chip fails at a test, the ATE logs the test result and skips the remaining tests in the test program and moves to the next chip and commences testing it.

Example 2 differs from the flow of example 1 at step 109 as depicted in drawing FIG. 1. In this example, the chips are tested under "stop on fail" condition so when a chip fails a test in the test program—test 9 in the present example, the automatic tester logs the failing test result associated with the failed chip at test 9 and skips all remaining tests in the test program.

In example 2, since no chips that fail test 9 will be tested with all tests that would follow test 9—tests 10 through 12—the number of candidates for the companion test is limited to the tests 1 through 8, which are performed ahead of test 9.

In summary, reduction of test time while maintaining product quality is important to modern manufacturers. The methods described in the above examples provide a systemic approach that can be applied broadly in many industries. By supplanting a test that is under statistical control with a companion test that can identify all or a majority of failed parts as outliers and then relabeling and screening out all the outliers as fails, one can safely and systematically reduce the test time and the associated cost without compromising the quality of the products.

Even though the two examples are directed to the test of a print head control chip, the methods disclosed in this application can be extended by a person skilled in art of product testing to test any product as long as the test results can be analyzed statistically. For example, the method may be applied to the test of any manufactured part of which the test results can be quantified and assume a normal distribution or any other statistical distributions. Therefore, the scope of this invention covers testing of many manufactures and is only limited by the claims of this application as listed below.

What is claimed is:

1. A testing method, comprising:
   testing a plurality of manufactured devices with an automated tester according to a test program that includes a plurality of tests;
   collecting testing result in terms of numerical values of the plurality of tests;
   comparing the numerical values of a first test to a first set of predetermined limits;
   determining based on the first set of predetermined limits that the test results of the first test are under statistical control;
   identifying all devices of the plurality of manufactured devices that failed the first test;
   comparing testing results of a second test of the plurality of manufactured devices to a second set of predetermined limits;
   determining the presence of outliers among the testing results of the second test; and
   determining that the outliers comprise testing results of the failed devices under the first test.

2. The testing method of claim 1, further comprising testing a second plurality of manufactured devices with an automated tester according to a second test program according to a second test program, which include a modified version of the first test and a modified version of the second test.

3. The testing method of claim 2, in which the modified first test is an abbreviated test and tests less than 100% of the second plurality of manufactured devices.

4. The testing method of claim 3, in which the abbreviated first test performs no testing on the second plurality of manufactured devices.

5. The testing method of claim 1, in which the plurality of manufactured devices include semiconductor devices.

6. The testing method of claim 2, further comprising identifying all of the manufactured devices that failed at least one of the tests of the test program and calculating test result in terms of a DPPM (defective parts per million) value.

7. The test method of claim 6, further comprising determining that the DPPM value is lower than a predetermined value.

8. The test method of claim 7, in which the step of determining that the DPPM value is lower than a predetermined value is prior to the step of testing a second plurality of manufactured devices with an automated tester according to a second test program according to a second test program.

* * * * *